US006879259B1

(12) United States Patent
Smith et al.

(10) Patent No.: US 6,879,259 B1
(45) Date of Patent: Apr. 12, 2005

(54) BATTERY VOLTAGE INDICATOR IN A PORTABLE COMPUTING DEVICE

(75) Inventors: Steven G. Smith, Roswell, GA (US); Lawrence E. Ertley, Stone Mountain, GA (US); Robert H. Willis, Jr., Louisville, KY (US); Curt Kaloustian, Atlanta, GA (US); Roland T. Morton, Jr., Alpharetta, GA (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 0 days.

(21) Appl. No.: 09/822,913

(22) Filed: Mar. 30, 2001

(51) Int. Cl.[7] .............................................. G08B 21/00
(52) U.S. Cl. ................. 340/636; 340/691.1; 340/691.3; 340/7.54; 702/6; 713/300
(58) Field of Search ............................. 340/636, 691.1, 340/691.3, 7.54; 702/6; 713/300

(56) References Cited

U.S. PATENT DOCUMENTS

| 5,345,392 A | * | 9/1994 | Mito et al. .................. 364/483 |
| 5,459,671 A | * | 10/1995 | Duley ......................... 364/483 |
| 5,477,129 A | * | 12/1995 | Myslinski .................... 320/48 |
| 5,691,742 A | * | 11/1997 | O'Connor et al. ........... 345/116 |
| 5,751,134 A | | 5/1998 | Hoerner et al. ............... 320/21 |
| 5,835,760 A | | 11/1998 | Harmer ....................... 395/652 |
| 6,065,122 A | | 5/2000 | Wunderlich et al. ........ 713/320 |
| 6,138,233 A | | 10/2000 | Lim ............................. 713/1 |
| 6,252,511 B1 | * | 6/2001 | Mondshine et al. ........ 340/636 |
| 6,323,775 B1 | * | 11/2001 | Hansson .................. 340/636.1 |
| 6,353,599 B1 | | 3/2002 | Bi et al. ...................... 370/328 |
| 6,457,123 B1 | | 9/2002 | Rollins ........................ 713/100 |
| 6,748,423 B1 | | 6/2004 | Khanna et al. ............. 709/210 |
| 6,757,838 B1 | | 6/2004 | Chaiken et al. ................. 714/5 |

OTHER PUBLICATIONS

Excerpt from "X-C 6250 System Programmer's Technical Reference," ITRONIX, A Dynatech Company, Apr. 1998, pp. cover page, pp. 10-5 to 10-9.

* cited by examiner

Primary Examiner—Jeffery Hofsass
Assistant Examiner—Tai Tan Nguyen
(74) Attorney, Agent, or Firm—Woodcock Washburn LLP

(57) ABSTRACT

Systems and methods for indicating the status of a battery in a portable computing device are disclosed. The methods include retrieving battery status data from a basic input-output system (BIOS) on the computing device, and comparing the retrieved battery status data to a predefined battery status threshold stored on the computing device. Based on the comparison of the battery status data to the predefined battery status threshold, a battery status indicator may be provided to an applications program on the computing device. The battery status data is reflective of a characteristic of the battery, such as battery voltage. A system according to the present invention includes a computer-readable medium having stored thereon computer-executable instructions for performing a method according to the present invention.

7 Claims, 3 Drawing Sheets

BATTERY VOLTAGE INDICATOR IN A PORTABLE COMPUTING DEVICE

CROSS-REFERENCE TO RELATED APPLICATIONS

The subject matter disclosed herein is related to the subject matter disclosed in copending application Ser. No. 09/822,912, filed on Mar. 30, 2001, entitled "Battery Capacity Indicator in a Portable Computing Device," the contents of which are hereby incorporated by reference. The subject matter disclosed herein is also related to the subject matter disclosed in copending application Ser. No. 09/822,905, filed on Mar. 30, 2001, entitled "Systems and Methods for Collecting BIOS Data from a Plurality of Remote Computing Devices," the contents of which are hereby incorporated by reference.

FIELD OF THE INVENTION

The present invention relates to portable computing devices. More particularly, the present invention relates to providing a battery status indicator in such portable computing devices.

BACKGROUND OF THE INVENTION

Portable computing devices such as laptop personal computers, personal digital assistants, and the like are becoming ubiquitous due to the advances in the computing field. Such devices, however, typically rely on a battery to supply electrical power so that the computing device can be used in a portable fashion. Consequently, a user of the computing device often must depend on a battery status indicator to provide a method of displaying a status of the battery level to inform the user that charging of the battery may be necessary. Methods for monitoring the battery status can include determining battery capacity (percentage of battery power remaining) or battery voltage (voltage level of the battery).

A manufacturer of computing devices typically incorporates a battery status indicator in the manufactured computing devices. One method of indicating the battery status includes accessing a Basic Input/Output System (BIOS) on the computing device. Typically, a BIOS includes a BIOS controller and BIOS data store. The BIOS data store may contain data representative of various aspects of the computing device, including, for example, power management settings and battery status data. The BIOS controller may include a set of instructions that perform various functions associated with maintaining the data in the BIOS data store (e.g., writing data to and reading data from the data store). The BIOS may be installed on a Read-Only Memory (ROM) chip or flash memory chip, for example, within the computing device.

Some manufacturer-provided battery status indicator programs interrogate the BIOS for battery status data that can be used to determine whether a battery status alert should be provided to the user. A battery status alert is a type of battery status indicator that alerts the user when a particular battery characteristic has fallen below a predefined level. In fact, some manufacturers provide stored programs that can be used to interrogate the BIOS to obtain this data for use in a battery status indicator or battery status alert.

Manufacturers of portable computing devices, however, typically confine users of such portable computing devices to the parameters provided thereby for indicating the status of the battery to the user. The battery status indicator provided by the manufacturer, however, may be inaccurate, or the battery status threshold, which triggers the battery status alert, may be set too low, thereby not providing adequate warning to the user to charge the battery.

Additionally, battery status indicators on the portable computing devices provided by the manufacturer are not integrated with applications programs that the users typically use on the computing device. It would be advantageous to users of such portable computing devices if a battery status indicator could be integrated into the applications program so that the user of the computing device would receive current, accurate battery status while using the applications program. Therefore, a need exists for a reliable and accurate battery status indicator, integrated into an applications program, with programmable parameters that permit the battery status threshold to be varied from that provided by the manufacturer.

BRIEF SUMMARY OF THE INVENTION

The present invention satisfies the aforementioned need by providing systems and methods for displaying a battery status indicator integrated into an applications program on a portable computing device, and for providing a battery status alert if the battery status falls below a predefined threshold. The battery status threshold can be a fixed parameter, or it can be a variable parameter that can be user-defined. By providing such a battery status indicator, the user of a computing device will be provided with a reliable battery status indicator appearing in an applications program, and will have ample warning when the battery voltage reaches an unacceptably low level.

The systems and methods of the present invention can be integrated into a software applications program on a computing device. The software applications program, once executed, executes a BIOS interrogating routine. The BIOS interrogating routine occasionally queries the BIOS to retrieve battery status data relating to the battery in the computing device. The retrieved battery status data is compared to the battery status threshold (which can be predefined or user-defined). Based on the comparison, a battery voltage indicator can be sent to and displayed in the software applications program.

BRIEF DESCRIPTION OF THE SEVERAL VIEWS OF THE DRAWING

Other features of the present invention are further apparent from the following detailed description of the embodiments of the present invention taken in conjunction with the accompanying drawings, of which.

DETAILED DESCRIPTION OF THE INVENTION

The present invention is directed to systems and methods for indicating the status of a battery in a portable computing device. More particularly, the present invention is directed to indicating the voltage level of the battery in the portable computing device, and providing a battery status alert if the voltage level falls below a predefined threshold. The method provides an accurate battery status indicator for display within an applications program in a portable computing device.

In one embodiment of the present invention, the methods are implemented into a software applications program residing on a portable computing device. The term software applications program hereinafter refers to software programs that perform on an operating system platform and have separate functionality from that of an operating system. The method, according to one embodiment of the present invention, comprises querying the BIOS for BIOS data relating to a battery in the computing device. Then, the BIOS data is compared to a predefined status threshold. Based on the comparison of the BIOS data to the predefined status threshold, a battery status indicator is provided to an applications program on the computing device for display to a user of the computing device.

Figure 1:
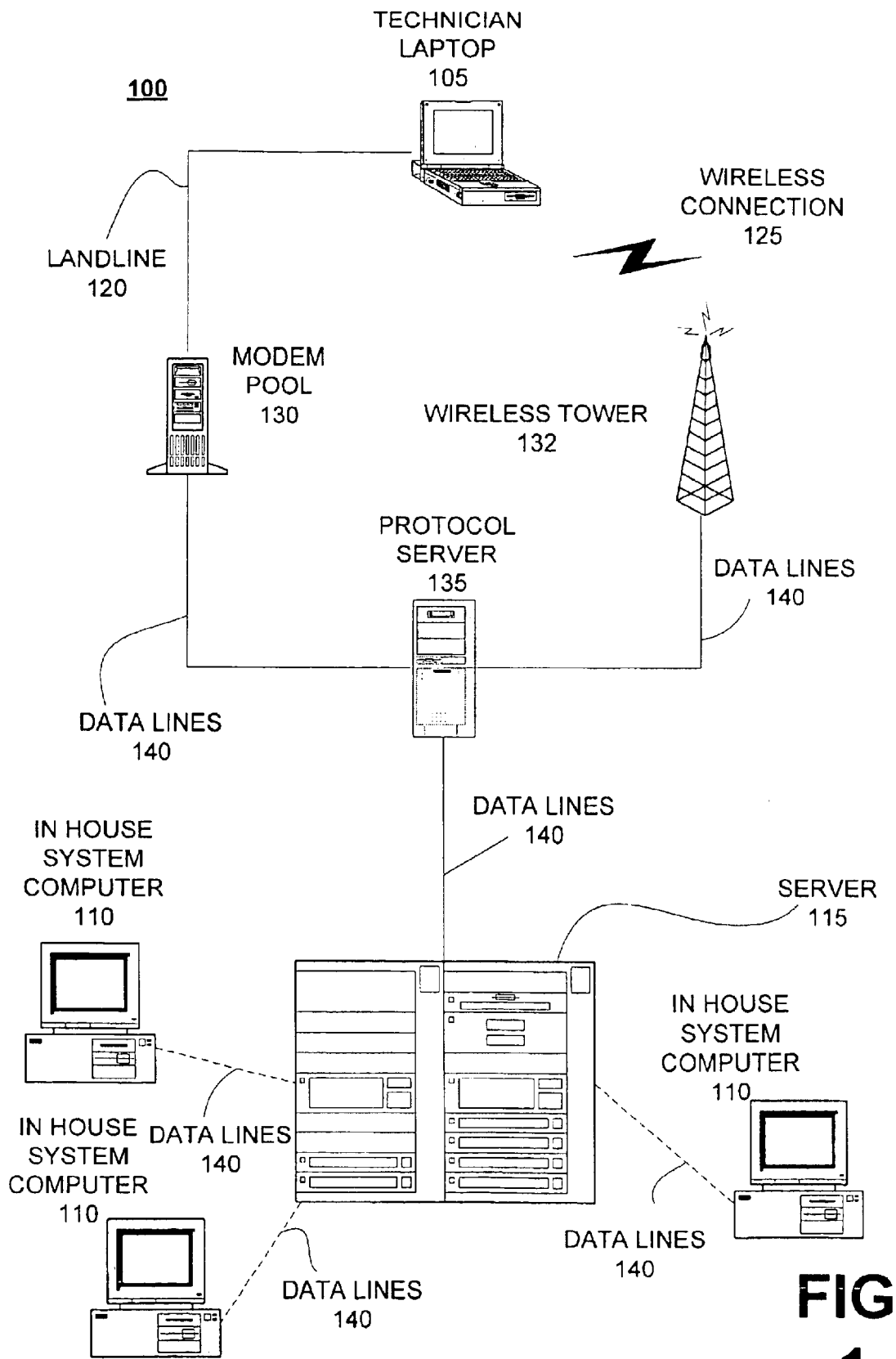
FIG. 1 depicts a network environment in which the present invention can be used.

Although the present invention is disclosed with reference to a portable laptop computing device, such as, for example, the laptop 105 as shown in FIG. 1, it should be appreciated that the present invention may be implemented in other portable computing devices having a BIOS, such as, for example, a personal digital assistant ("PDA") or the like, without departing from the scope of the present invention.

FIG. 1 shows an exemplary network in which the aspects of the present invention may be implemented. FIG. 1 shows a communication network 100 that allows the exchange of information between a portable technician laptop 105 and in-house system computers 110 and/or server 115. The laptop 105 may communicate with the network 100 either through a physical connection, such as, for example, a landline 120 (i.e., a physical connection through data lines) or by way of a wireless connection 125. Using a physical connection, the laptop 105 connects to landline 120. The landline 120 connects to a modem pool 130, and the modem pool 130 in turn connects to a protocol server 135 by way of data lines 140.

Alternatively, the laptop 105 may communicate with the network 100 through a wireless connection 125. The wireless connection 125 enables the laptop to connect to wireless tower 132. The wireless tower 132 connects to the protocol server 135 by way of data lines 140. The wireless connection 125 is particularly useful for users of laptop 105 that demand mobility while communicating with network 100, such as in the case of a field technician, for example.

The protocol server then provides communication to server 115 through data lines 140. In-house systems computers 110 are also connected to server 115 through data lines 140. This network configuration allows data to be transferred between all components of the network 100, particularly between users of laptop 105 and users of the in-house systems computers 110.

Figure 2:
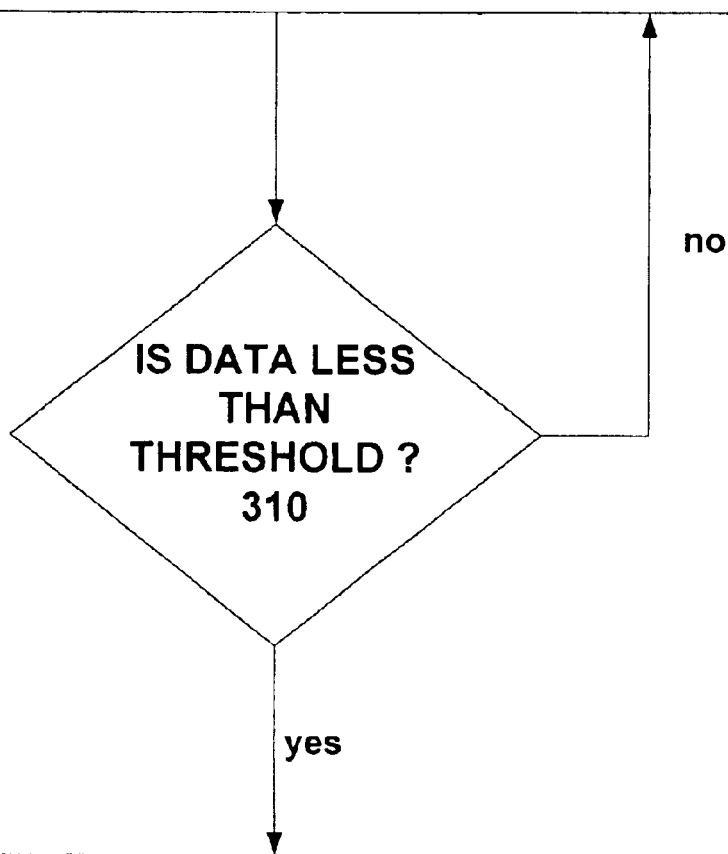
FIG. 2 is a block diagram illustrating a method of indicating the status of a battery in a portable computing device in accordance with the present invention.

With reference to FIG. 2 and in accordance with the present invention, a method 300 is shown for indicating the status of a battery in a portable computing device having a BIOS. The method 300 comprises retrieving battery status data from the BIOS of the computing device at step 302. The BIOS data relates to a characteristic of the battery in the computing device. For example, and in accordance with the present invention, the BIOS data may relate to the current voltage of the battery in the computing device.

In one embodiment of the present invention, a BIOS interrogating routine is used to retrieve battery status data from the BIOS. In this manner, an applications program executing on the computing device may initiate the BIOS interrogating routine to access or interrogate a BIOS data store (e.g., element 335 in FIG. 3) in order to query the BIOS for BIOS data. The BIOS interrogating routine queries the BIOS by retrieving data associated with a device input/output (I/O) number. Such device I/O number is basically an index into the BIOS data store corresponding to a piece of hardware (which may or may not be located on the computing device). For example, the program, in accordance with the present invention, retrieves data based on a device I/O number associated with the battery in the computing device, to retrieve data relating to battery voltage, for example, or to some other characteristic of the battery.

Once the battery status data is retrieved, the battery status data is compared to a predefined status threshold at step 310. Preferably, where the battery status data reflects the battery voltage, the predefined status threshold is set to 7 volts. Typically, this will be higher than most manufacturer-supplied thresholds.

In one embodiment of the present invention, the predefined status threshold is programmed into the BIOS interrogating routine. In this manner, once the battery status data is retrieved from the BIOS, the BIOS interrogating routine compares the retrieved battery status data to the predefined status threshold coded into the BIOS interrogating routine.

Alternatively, the predefined status threshold can be a variable parameter, and can be defined by the user of the computing device. In this manner, the user may selectively define the parameters of the predefined status threshold to various threshold values, e.g., depending on the environment in which the user is operating.

Based on the comparison of the battery status data to the battery status threshold, a battery status indicator is provided to an applications program on the computing device at step 320. For example, the battery status indicator may be sent to an applications program that is currently being executed. In this manner, while the user of the computing device is operating the applications program, the user may view a battery status indicator integrated into the user interface of the applications program. Such an integrated battery indicator would allow the user to continuously operate the applications program while simultaneously monitoring the battery status.

Preferably, the applications program is an interface to a remote network, such as might be used by a field service technician in the telecommunications industry operating a laptop computer during a service call. The technician logs onto the network via a user interface at the remote computing device, and then interacts with the network server to request and receive information necessary for the technician to troubleshoot and resolve problems in the field. Because the field technician will frequently be using the laptop in a portable fashion (i.e., not plugged into a power source), and usually far from a power source, a battery status indicator integrated into the user interface will provide notice to the field technician that the battery is about to die, and that he should locate a power source. Because the threshold is set higher than the manufacturer provided threshold, the programmer (or user) of the remote laptop can compensate for the expected amount of time it will take the user to reach a power source. The applications program can be any such applications program, however, such as a word processing application, for example.

The battery status indicator alerts the user of the device that the battery status level has reached a certain level. For example, in one embodiment of the present invention, the battery status indicator is a low battery indicator. In this manner, a low battery indicator or battery status alert is displayed when the battery status data is less than (or equal to) the predetermined status threshold. For example, if the retrieved battery status indicates the battery voltage is 6.5 volts, and the predefined status threshold is 7 volts, a low battery indicator will be sent to an application on the computing device.

The applications program can then provide the low battery indicator in a manner that is perceptible to the user. For example, the low battery indicator can include a pop-up window with text indicating a low battery level, or a display embedded into the user interface of the applications program. The low battery indicator can include a visual warning representation, such as a flashing red light, for example, or an audible alert.

In an embodiment wherein the threshold is user-definable, and the user is operating the computing device in an environment which is far from a recharging source, the user may want to predefine the status threshold to such a level as to provide adequate warning to enable the user to find a recharging source (e.g., the user may want to set the battery status threshold higher than 7 volts). Alternatively, if the user is operating the computing device close to a recharging source, the user may set the predefined status threshold to a level that provides little warning before the battery drains completely.

In another embodiment of the present invention, the predefined status threshold is set such that a battery status indicator is continuously displayed in an applications program. In this manner, the battery status indicator may represent the battery status data retrieved from the BIOS. Therefore, the user may continuously view the battery capacity within the user interface of an applications program on the computing device. For example, if the predefined status threshold is set to the maximum voltage of the battery (e.g., 12 volts), a battery status indicator will be sent to an applications program on the computing device whenever the battery voltage is below such maximum voltage.

The applications program can then provide the battery status indicator to the user, via the user interface of the applications program, in a manner that is perceptible to the user. It should be appreciated that, once the battery status indicator is sent to the applications program, the indicator may be presented in any manner. For example, the battery indicator may include a visual indicator, such as a flashing number indicating the battery voltage, or a graphical representation of the battery voltage, such as a gauge or a bar, for example. Alternatively or additionally, the battery status indicator may include an audible indictor, such as a bell or warning tone.

Figure 3:
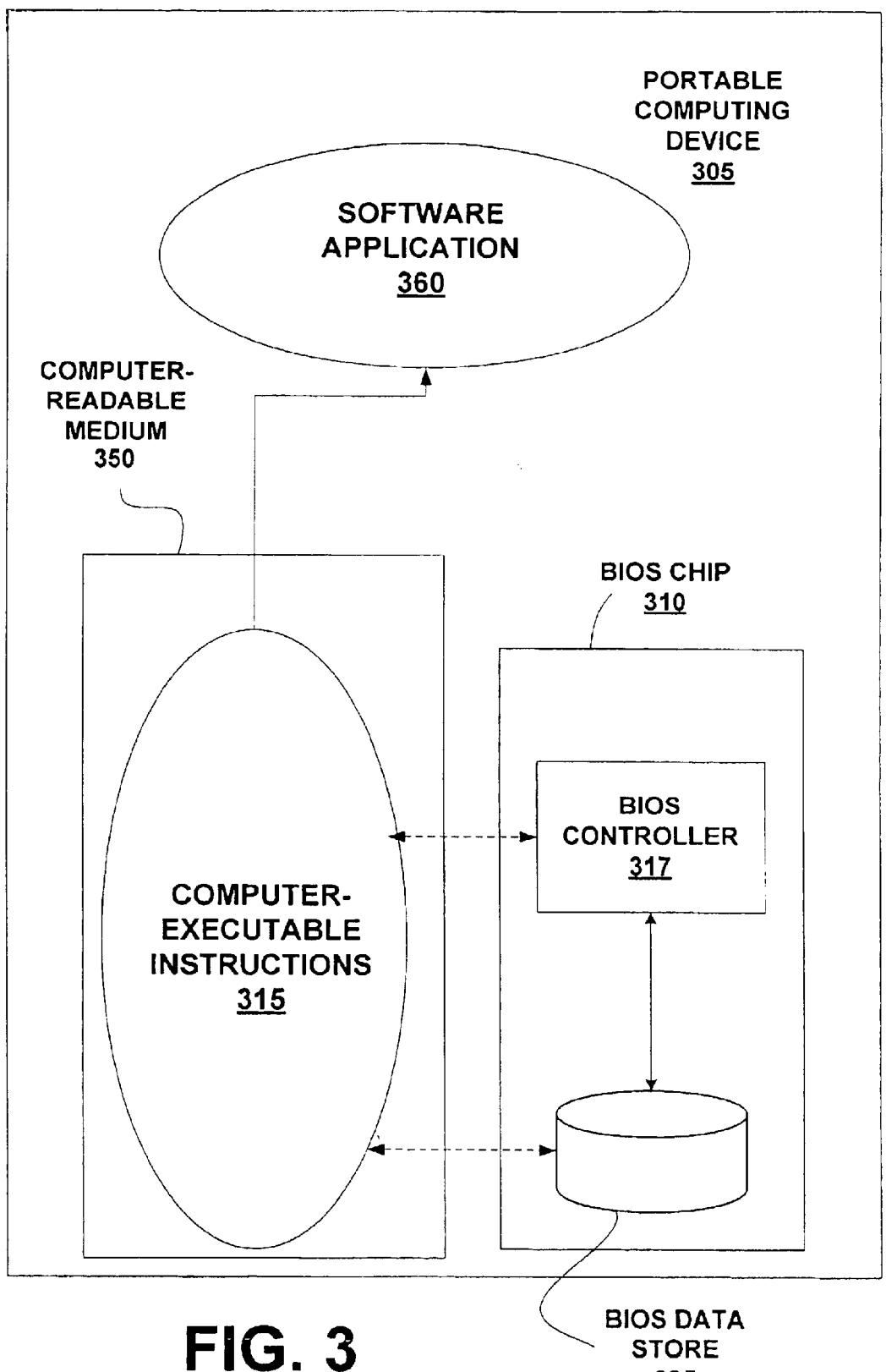
FIG. 3 is a block diagram of a portable computing having a software program in accordance with the present invention.

FIG. 3 is a block diagram illustrating a portable computing device 305 having a computer-readable medium 350 on which computer-executable instructions are stored thereon for performing a method according to the present invention for indicating the status of a battery in the portable computing device. Preferably, portable computer 305 is a laptop computer, although any portable computing device, either stand alone or connected to a network, may be used without departing from the principles of the present invention.

Computer-readable medium 350 can be a read only memory (ROM) device on computing device 305, such as can be found in a computing device's hard drive, for example. Alternatively, medium 350 can be a floppy disk, compact disk (CD), or other removable computer-readable medium.

According to the present invention, computing device 305 includes a BIOS interrogating application 315, and a BIOS chip 310 having a BIOS controller 317 and data store 335. The BIOS chip 310 may be a ROM chip, flash memory chip, or the like. Additionally, data associated with the BIOS controller 317 may be stored within data store 335, which may be stored within the BIOS chip 310 or in an external storage location, which may be within computing device 305 or may be external to computing device 305.

Preferably, the portable computing device 305 includes instructions 315 thereon for indicating the status of the battery (not shown) in the portable computing device 305 by accessing the BIOS chip 310 on the computing device 305. Preferably, the instructions 315 of the computing device 305 are organized for retrieving battery status data from the BIOS data store 335. As shown, the instructions 315 may retrieve such data either through the BIOS controller 317 or through the BIOS data store 335 without departing from the principles of the present invention.

Then, instructions 315 compare the retrieved battery status data to a predefined battery status threshold stored on the computing device 305. Based on the comparison of the battery status data to the predefined battery status threshold, the instructions 315 provide a battery status indicator to an applications program 360 executing on the computing device.

While the present invention has been described in connection with the embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for indicating the status of a battery in a portable computing device, the method comprising:

retrieving battery status data from a basic input-output system (BIOS) on the computing device by an applications program initiating a BIOS interrogating routine to retrieve battery status, the battery status data reflective of a characteristic of the battery;

comparing the retrieved battery status data to a predefined battery status threshold stored on the computing device; and based on the comparison of the battery status data to the predefined battery status threshold, providing a battery status indicator to the applications program on the computing device, wherein the applications program includes a user interface to a remote network, for integration into the user interface of the applications program.

2. The method of claim 1, wherein retrieving battery status data from a basic input-output system (BIOS) on the computing device comprises retrieving battery status data relating to the voltage of the battery from the BIOS on the computing device.

3. The method of claim 1, wherein providing the battery status indicator comprises providing a battery status indicator that causes a low battery alert to be provided when the comparison indicates that the battery status data is less than the predefined status threshold.

4. The method of claim 1, wherein providing the battery status indicator comprises displaying a gauge representative of a current battery status.

5. The method of claim 1, wherein the predefined battery status threshold is user-definable.

6. A computer-readable medium having stored thereon computer-executable instructions for performing a method for indicating the status of a battery in a portable computing device, the method comprising:

retrieving battery status data from a basic input-output system (BIOS) on the computing device by an applications program initiating a BIOS interrogating routine to retrieve battery status, the battery status data reflective of a characteristic of the battery;

comparing the retrieved battery status data to a predefined battery status threshold stored on the computing device; and based on the comparison of the battery status data to the predefined battery status threshold, providing a battery status indicator to the applications program on the computing device, wherein the applications program includes a user interface to a remote network, for integration into the user interface of the applications program.

7. The computer-readable medium of claim 6, having stored thereon computer-executable instructions for retrieving battery status data relating to the voltage of the battery from the BIOS on the computing device.

* * * * *